(12) United States Patent
Wei et al.

(10) Patent No.: US 12,666,819 B2
(45) Date of Patent: Jun. 23, 2026

(54) DISPLAY MODULE AND DISPLAY DEVICE

(71) Applicants: Yunnan Invensight Optoelectronics Technology Co., Ltd., Kunming (CN); BOE Technology Group Co., Ltd., Beijing (CN)

(72) Inventors: Junbo Wei, Beijing (CN); Shengji Yang, Beijing (CN); Pengcheng Lu, Beijing (CN); Kuanta Huang, Beijing (CN); Yuanlan Tian, Beijing (CN)

(73) Assignees: Yunnan Invensight Optoelectronics Technology Co., Ltd., Kunming (CN); BOE Technology Group Co., Ltd., Beijing (CN)

( * ) Notice: Subject to any disclaimer, the term of this patent is extended or adjusted under 35 U.S.C. 154(b) by 603 days.

(21) Appl. No.: 18/023,380

(22) PCT Filed: Mar. 30, 2022

(86) PCT No.: PCT/CN2022/084151
§ 371 (c)(1),
(2) Date: Feb. 27, 2023

(87) PCT Pub. No.: WO2023/184256
PCT Pub. Date: Oct. 5, 2023

(65) Prior Publication Data
US 2024/0276801 A1     Aug. 15, 2024

(51) Int. Cl.
*H10K 59/131*      (2023.01)
*H10K 59/80*       (2023.01)

(52) U.S. Cl.
CPC ......... *H10K 59/131* (2023.02); *H10K 59/872* (2023.02)

(58) Field of Classification Search
CPC ....... H10K 59/131; H10K 59/872; H05K 1/00
See application file for complete search history.

(56) References Cited

U.S. PATENT DOCUMENTS

| | | | | |
|---|---|---|---|---|
| 11,805,686 B2 * | 10/2023 | Pu | | H10K 59/131 |
| 2020/0160782 A1 | 5/2020 | Qian et al. | | |
| 2021/0097900 A1 | 4/2021 | Cui | | |
| 2021/0183980 A1 | 6/2021 | Wu | | |
| 2022/0320463 A1 * | 10/2022 | Tomiyoshi | | H10K 59/38 |
| 2023/0180582 A1 | 6/2023 | Pu et al. | | |

FOREIGN PATENT DOCUMENTS

| | | |
|---|---|---|
| CN | 103296056 A | 9/2013 |
| CN | 103345316 A | 10/2013 |
| CN | 206301796 U | 7/2017 |
| CN | 107393422 A | 11/2017 |
| CN | 108807717 A | 11/2018 |

(Continued)

*Primary Examiner* — Steven B Gauthier
*Assistant Examiner* — Alvin L Lee
(74) *Attorney, Agent, or Firm* — Ling Wu; Stephen Yang; Ling and Yang Intellectual Property

(57)                ABSTRACT
A display module is provided, which includes a circuit board and a display substrate disposed on a first surface of the circuit board, the first surface of the circuit board comprises a flat area and an non-flat area located at a periphery of the flat area, the display substrate is disposed in the flat area, and the non-flat area is provided with electronic components.

19 Claims, 5 Drawing Sheets

(56)　　　　　　　References Cited

FOREIGN PATENT DOCUMENTS

| | | | |
|---|---|---|---|
| CN | 108882523 | A | 11/2018 |
| CN | 109935195 | A | 6/2019 |
| CN | 209912426 | U | 1/2020 |
| JP | 2013-157328 | A | 8/2013 |
| JP | 2014178614 | A　* | 9/2014 |
| WO | 2021035530 | A1 | 3/2021 |

* cited by examiner

Display Device

Display Module

FIG. 10

DISPLAY MODULE AND DISPLAY DEVICE

CROSS-REFERENCE TO RELATED APPLICATION

The present application is a U.S. National Phase Entry of International Application PCT/CN2022/084151 having an international filing date of Mar. 30, 2022, entitled "Display Module and Display Device", and the entire contents of the above-identified application are hereby incorporated by reference.

TECHNICAL FIELD

Embodiments of the disclosure relate to, but are not limited to, the field of display technologies, and more particularly to a display module and a display device.

BACKGROUND

Micro Organic Light-Emitting Diode (Micro-OLED) is a micro-display developed in recent years, and OLED on Silicon is one of them. The OLED on Silicon has advantages such as small size and high resolution, and is manufactured by mature complementary metal oxide semiconductor (CMOS) integrated circuit technology. It can not only realize active addressing of pixels, but also realize manufacturing of a pixel driving circuit, a timing control (TCON) circuit, an overcurrent protection (OCP) circuit, and the like on a silicon-based substrate, which is conducive to reducing a system volume and realize lightweight. The OLED on Silicon is widely used in virtual reality (VR), augmented reality (AR) and other near-eye display fields, such as AR/VR head-mounted display devices.

SUMMARY

The following is a summary of subject matter described herein in detail. The summary is not intended to limit the protection scope of claims.

An embodiment of the present disclosure provides a display module, which includes a circuit board and a display substrate disposed on a first surface of the circuit board; the first surface of the circuit board includes a flat area and an non-flat area located at a periphery of the flat area, the display substrate is disposed in the flat area, and the non-flat area is provided with electronic components.

An embodiment of the present disclosure further provides a display device, which includes the display module.

Other aspects may be understood upon reading and understanding of the drawings and detailed description.

BRIEF DESCRIPTION OF DRAWINGS

Accompanying drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of components in the drawings do not reflect actual scales, and are only intended to schematically illustrate contents of the present disclosure.

Figure 10:
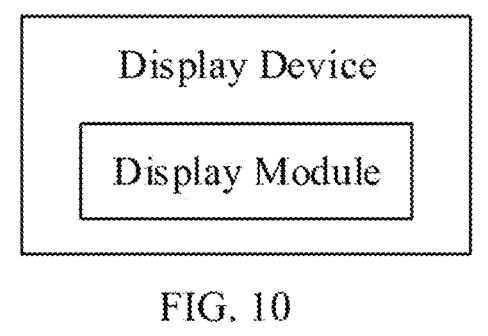

FIG. 10 is a block diagram showing a display device comprising a display module according to some exemplary embodiments.

DETAILED DESCRIPTION

Figures 1, 2:
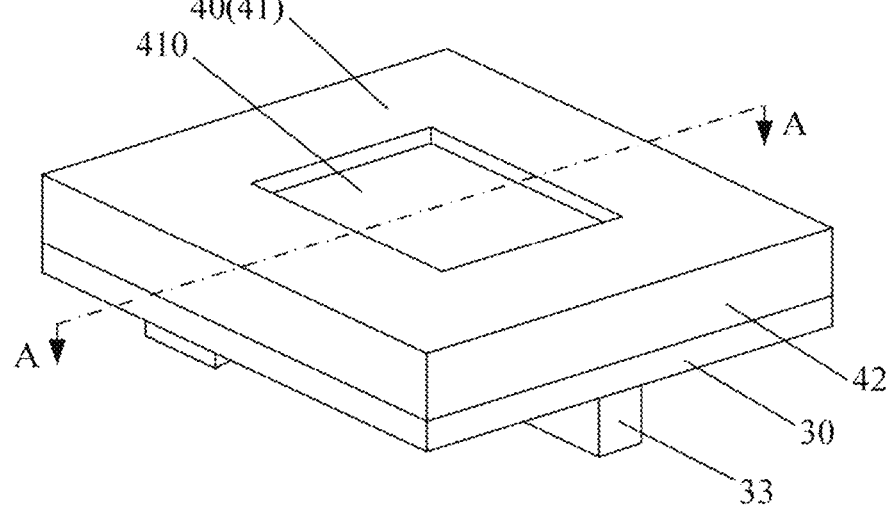
FIG. 1 is a schematic diagram of a three-dimensional structure of a display module according to some exemplary embodiments.
FIG. 2 is a schematic diagram of an assembled structure of a circuit board and a display panel of the display module in FIG. 1.

Those of ordinary skills in the art should understand that modifications or equivalent replacements may be made to the technical solutions of the embodiments of the present disclosure without departing from the spirit and scope of the technical solutions of the embodiments of the present disclosure, and should all fall within the scope of the claims of the present disclosure.

An embodiment of the present disclosure provides a display module, which includes a circuit board and a display substrate disposed on a first surface of the circuit board. The first surface of the circuit board includes a flat area and an non-flat area located at a periphery of the flat area, the display substrate is disposed in the flat area, and the non-flat area is provided with electronic components.

In the display module according to the embodiment of the present disclosure, the display substrate is disposed in the flat area of the first surface of the circuit board, electronic components are disposed in the non-flat area of the first surface of the circuit board, that is, the electronic components are arranged around the periphery of the display substrate. In this way, it is possible to ensure that a portion of the circuit board in contact with the display substrate is a flat surface, and a surface of the circuit board facing away from the display substrate is a flat surface. When the display module is applied to a complete machine of a display device (such as AR/VR display device), it is beneficial to alignment of the display module with optical structures in the complete machine of the display device, and ensures that the display module has relatively high display uniformity.

In some exemplary embodiments, in a direction perpendicular to the display substrate, heights of the electronic components are lower than a height of a surface of the display substrate facing away from the circuit board.

In some exemplary embodiments, the display substrate includes a display area and a non-display area located at a periphery of the display area. In a plane parallel to the display substrate, a distance between an edge of the circuit board and an edge of the display substrate is greater than a width of the non-display area.

In some exemplary embodiments, the display module further includes a plastic frame disposed on the first surface of the circuit board and covering the non-flat area.

In an example of this embodiment, the display substrate includes a display area and a non-display area located at a periphery of the display area. The plastic frame also covers the non-display area of the display substrate and exposes the display area.

By way of example, the non-display area includes a bonding area located at a side of the display area, the bonding area is provided with a first pad. A second pad is disposed at a position in the non-flat area close to the bonding area, and the first pad is connected with the second pad through a metal line. The plastic frame also covers the metal line.

By way of example, the first pad is disposed to be close to a first side edge of the display substrate, and the second pad is disposed to be close to a first side edge of the circuit board, wherein a distance between the first side edge of the circuit board and the first side edge of the display substrate is greater than a distance between the remaining side edges of the circuit board and corresponding side edges of the display substrate.

By way of example, a test pad is provided on the surface of the circuit board facing away from the display substrate at a position corresponding to the bonding area, and the bonding area is further provided with a third pad connected with the test pad.

In some exemplary embodiments, the display module may further include a plastic frame disposed on a first surface of the circuit board and a cover plate disposed on a surface of the display substrate facing away from the circuit board. The display substrate includes a display area and a non-display area located at a periphery of the display area, and the cover plate completely covers the display area. The plastic frame includes a frame plate provided with an opening and a first annular support portion disposed on a first side surface of the frame plate and disposed along a circumferential edge of the frame plate away from the opening. The first annular support portion is fixed on a portion of the first surface of the circuit board close to the circumferential edge, and a portion of the first side surface of the frame plate close to the opening is supported on the cover plate, and an orthographic projection of the opening on the circuit board contains an orthographic projection of the display area on the circuit board.

Figure 3:
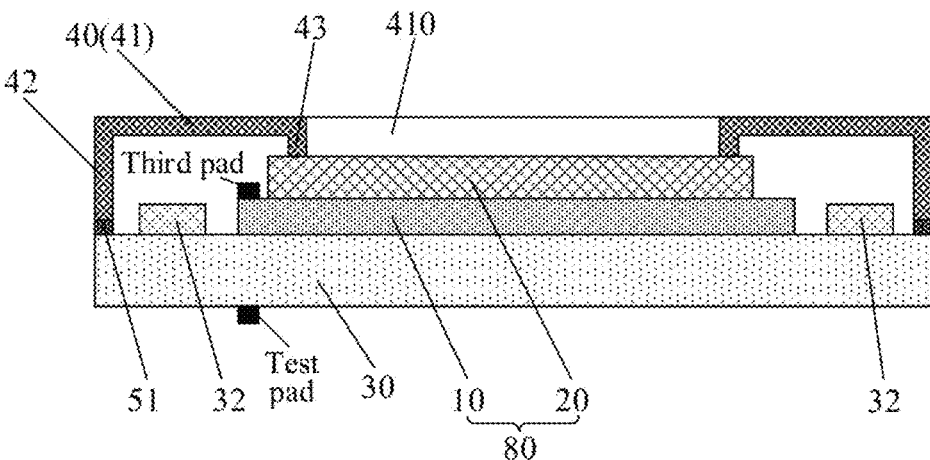
FIG. 3 is a schematic diagram of a cross-sectional structure along A-A of the display module in FIG. 1 in some exemplary embodiments.

In some exemplary embodiments, as shown in FIG. 1, FIG. 2 and FIG. 3, FIG. 1 is a schematic diagram of a three-dimensional structure of a display module according to some exemplary embodiments, FIG. 2 is a schematic diagram of an assembled structure of a circuit board and a display panel of the display module in FIG. 1, and FIG. 3 is a schematic diagram of a cross-sectional structure along A-A of the display module in FIG. 1 according to some exemplary embodiments. The display module includes a circuit board 30 and a display panel 80 and a plastic frame 40 disposed on a first surface of the circuit board 30. The display panel 80 includes a display substrate 10 and a cover plate 20.

The first surface of the circuit board 30 includes a flat area and a non-flat area located at a periphery of the flat area. The display substrate 10 is provided in the flat area, and the non-flat area is provided with electronic components 32, such as resistors, capacitors, inductors, etc.

The display substrate 10 includes a display area and a non-display area located at a periphery of the display area. In a plane parallel to the display substrate 10, a distance between an edge of the circuit board 30 and an edge of the display substrate 10 may be greater than a width of the non-display area. In this way, it is ensured that the circuit in the non-flat area of the circuit board 30 will not be lapped with the display substrate 10, and there is no problem of short circuit.

The non-display area includes a bonding area located at a side of the display area, and the bonding area is provided with a first pad 103. A second pad 31 is provided at a position in the non-flat area close to the bonding area, and the first pad 103 is connected with the second pad 31 through a metal line 61 to bond the display substrate 10 to the circuit board 30.

The first pad 103 is disposed to be close to a first side edge of the display substrate 10, and the second pad 31 is disposed to be close to a first side edge of the circuit board 30, a distance between the first side edge of the circuit board 30 and the first side edge of the display substrate 10 may be greater than distances between the remaining side edges of the circuit board 30 and corresponding side edges of the display substrate 10. Thus, the distance between the first side edge of the circuit board 30 and the first side edge of the display substrate 10 is relatively large, which facilitates arrangement of the second pad 31 and the metal line 61 and ensures effectiveness of the metal line 61.

A test pad may be provided on a surface of the circuit board 30 facing away from the display substrate 10 at a position corresponding to the bonding area, and the bonding area of the display substrate 10 may further be provided with a third pad connected with the test pad, through which the display substrate 10 can be tested for voltage, impedance, etc.

The cover plate 20 is disposed at a display side of the display substrate 10 and completely covers the display area and exposes the first pad 103. The plastic frame 40 is disposed on the first surface of the circuit board 30 and covers the non-flat area. The plastic frame 40 can also cover the non-display area of the display substrate 10 and expose the display area, wherein the plastic frame 40 also covers the metal line 61. In this way, the plastic frame 40 can protect the electronic components 32 and the circuit in the non-flat area of the circuit board 30 to prevent the electronic components 32 from being squeezed and damaged. The plastic frame 40 can also protect the non-display area of the display substrate 10 and the metal line 61.

In the direction perpendicular to the display substrate 10, heights of the electronic components 32 may be lower than a height of the surface of the display substrate 10 facing away from the circuit board 30, so that the electronic component 32 does not affect a thickness of the display substrate 10, and the plastic frame 40 easily covers the non-flat area.

The plastic frame 40 may include a frame plate 41 provided with an opening 410 and a first annular support portion 42 disposed on a first side surface of the frame plate 41 and disposed along a circumferential edge of the frame plate 41 away from the opening 410. The first annular support portion 42 is fixed to a portion of the first surface of the circuit board 30 close to the circumferential edge, and a portion of the first side surface of the frame plate 41 close to the opening 410 is supported on the cover plate 20. An orthographic projection of the opening 410 on the circuit board 30 contains an orthographic projection of the display area on the circuit board 30. In this way, an area of the display substrate 10 that is not covered by the cover plate 20, the non-flat area of the circuit board 30 and the metal line 61 can be shielded by the plastic frame 40 provided, thereby avoiding damages to the display substrate 10, the electronic components 32 of the circuit board 30, and the metal line 61. Moreover, the plastic frame 40 will not easily damage the metal line 61, thus ensuring a reliable electrical connection between the display substrate 10 and the circuit board 30. The plastic frame 40 is supported on the cover plate 20, and a surface of the plastic frame 40 facing away from the circuit board 30 protrudes from the surface of the cover plate 20, thereby protecting the cover plate 20 and preventing edges of the cover plate 20 from being damaged and light leaking. The arrangement of the plastic frame 40 can improve a surface flatness of the display module, which is beneficial to the effective matching and alignment of the display module with the optical structures in the complete machine of the display device.

In some exemplary embodiments, as shown in FIG. 3, a second annular support portion 43 may be provided on the first side surface of the frame plate 41 along a circumferential edge of the opening 410, and the second annular support portion 43 is supported on the cover plate 20. A shape of the second annular support portion 43 may be same as a shape of the cover plate 20, for example, both of them may be rectangular. In other embodiments, a circumferential edge of the first side surface of the frame plate close to the opening may be directly supported on the cover plate. In this example, an end face of the first annular support portion 42 away from the frame plate 41 can be fixed to the circuit board 30 by fixing glue 51, thereby fixing the plastic frame 40 to the circuit board 30.

Figure 4:
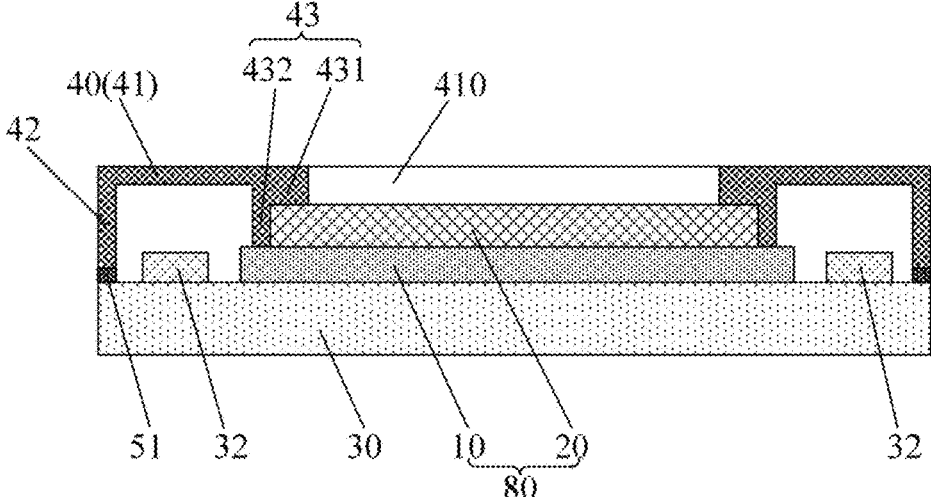
FIG. 4 is a schematic diagram of a cross-sectional structure along A-A of the display module in FIG. 1 in some other exemplary embodiments.

In some other exemplary embodiments, as shown in FIG. 2 and FIG. 4, FIG. 4 is a schematic diagram of a cross-sectional structure along A-A of the display module in FIG. 1 according to some other exemplary embodiments, in which the non-display area of the display substrate 10 includes a bonding area located at a side of the display area, the bonding area is provided with a first pad 103. A second pad 31 is disposed at a position in the non-flat area of the circuit board 30 close to the bonding area, and the first pad 103 is connected to the second pad 31 through a metal line 61. The first pad 103 is exposed by the cover plate 20, a circumferential edge of the cover plate 20 protrudes from a circumferential edge of the display area, and a circumferential edge of the display substrate 10 may protrude from the circumferential edge of the cover plate 20. The first side surface of the frame plate 41 may be provided with a second annular support portion 43 along a circumferential edge of the opening 410. The second annular support portion 43 is supported on a portion of the cover plate 20 close to the circumferential edge thereof and on the non-display area of the display substrate 10 except the bonding area. In this example, on one hand, the second annular support portion 43 functions in supporting, and on the other hand, the second annular support portion 43 is also supported on the non-display area of the display substrate 10 except the bonding area, so that the second annular support portion 43 is also partially located at a circumferential side wall of the cover plate 20, and the second annular support portion 43 can function in limiting, therefore the plastic frame 40 can be fixed more firmly. In this example, an end face of the first annular support portion 42 away from the frame plate 41 can be fixed to the circuit board 30 by the fixing glue 51, so that the plastic frame 40 is fixed to the circuit board 30.

Exemplarily, As shown in FIG. 4, the display substrate 10 and the cover plate 20 may both be rectangular, the display substrate 10 includes a first side edge and a second side edge opposite to each other, and a third side edge and a fourth side edge opposite to each other, and an area of the display substrate 10 close to the first side edge is the bonding area. The second annular support portion 43 is correspondingly provided as rectangular, the second annular support portion 43 may include an annular base 431 and a rib 432 disposed on an end face of the annular base 431 away from the frame plate 41. The second annular support portion 43 is not provided with the rib at a position corresponding to the bonding area (i.e., the rib 432 is disposed to avoid the bonding area). The end face of the annular base 431 away from the frame plate 41 is supported on a portion of a surface of the cover plate 20 facing away from the display substrate 10 and close to the circumferential edge of the cover plate 20, the rib 432 is located at the circumferential side wall of the cover plate 20 and supported on portions of the display substrate 10 close to the second side edge, the third side edge and the fourth side edge respectively, and is configured to avoid the bonding area to prevent damages to the metal line 61.

Figure 5:
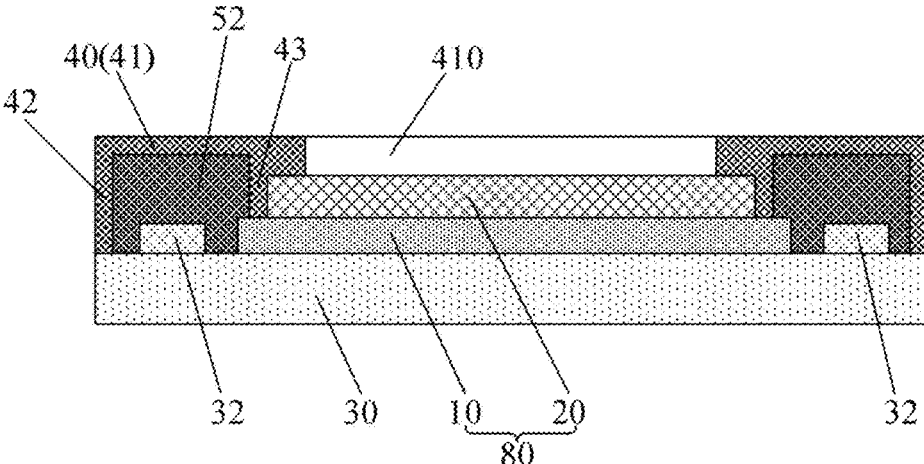
FIG. 5 is a schematic diagram of a cross-sectional structure along A-A of the display module in FIG. 1 in some further exemplary embodiments.

In some other exemplary embodiments, as shown in FIG. 5, FIG. 5 is a schematic diagram of a cross-sectional structure along A-A of the display module in FIG. 1 according to some other exemplary embodiments, the structure of the plastic frame 40 in this example may be the same as that of the plastic frame 40 in the example of FIG. 4, and glue 52 may be filled between the first side surface of the frame plate 41 and the circuit board 30, and the glue 52 fixes the plastic frame 40 to the circuit board 30. By way of example, the glue 52 may also cover the metal line to improve a moisture blocking effect, and the glue 52 may fill a gap between the first side surface of the frame plate 41 and the circuit board 30. As an example, the metal line may be a gold line or an aluminum line, the gold line has high hardness and anti-oxidation ability, the gold line can be used without protection of the glue 52 and the metal line can be avoided from being damaged during a gluing process. The aluminum line is prone to oxidation, and the glue 52 can cover the metal line to improve the moisture blocking effect.

Figure 6:
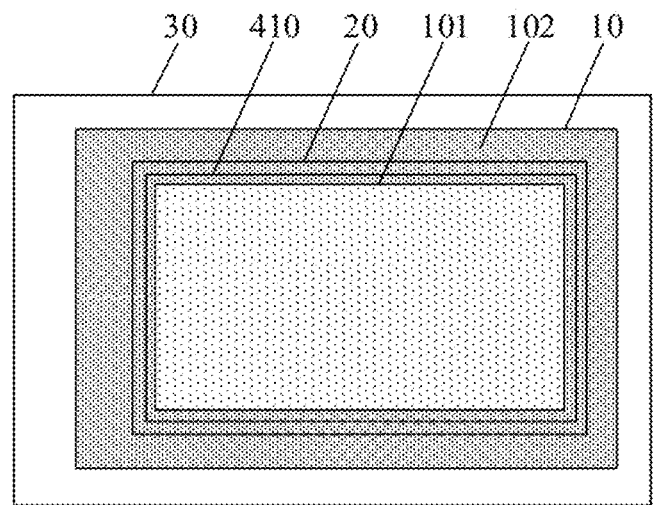
FIG. 6 is a schematic diagram of a planar structure of a display module according to some exemplary embodiments.

In some exemplary embodiments, as shown in FIG. 6, FIG. 6 is a schematic diagram of a planar structure of a display module according to some exemplary embodiments, in which the cover plate 20 completely covers the display area 101 of the display substrate 10. An orthographic projection of the cover plate 20 on the circuit board 30 contains an orthographic projection of the opening 410 on the circuit board 30, and the orthographic projection of the opening 410 on the circuit board 30 contains an orthographic projection of the display area 101 on the circuit board 30. Thereby, an image displayed in the display area 101 can be viewed from the opening 410 of the plastic frame.

In an example of this embodiment, as shown in FIG. 6, a size of the opening 410 may be larger than a size of the display area 101, and a distance between the circumferential edge of the cover plate 20 and the circumferential edge of the opening 410 may be smaller than a distance between the circumferential edge of the cover plate 20 and the circumferential edge of the display area 101 in a plane parallel to the display substrate 10. By way of example, the distance between the circumferential edge of the cover plate 20 and the circumferential edge of the display area 101 may be greater than 500 microns, for example, the distance may be 500 microns to 1000 microns.

In some exemplary embodiments, the circumferential edge of the cover plate protrudes from the circumferential edge of the display area. A side edge of the bonding area away from the display area protrudes from a corresponding side edge of the cover plate, and remaining side edges of the display substrate may protrude from or be flush with corresponding side edges of the cover plate. By way of example, as shown in FIG. 6, the display substrate 10 and the cover plate 20 are both rectangular in shape and each includes four side edges, and the display area 101 is rectangular. The circumferential edge of the cover plate 20 protrudes from the circumferential edge of the display area 101, and the four side edges of the display substrate 10 all protrude from corresponding side edges of the cover plate 20.

In some exemplary embodiments, as shown in FIG. 2, the circuit board 30 and the display substrate 10 may both be rectangular and include four side edges. The first pads 103 are disposed to be close to the first side edge of the display substrate 10 and the second pads 31 are disposed to be close to the first side edge of the circuit board 30. The first pad 103 and the second pad 31 may each be arranged in multiple and arranged in a row, and in some other embodiments, the multiple first pads 103 may be arranged in one row and the multiple second pads 31 may be arranged in two rows. The electronic components 32 of the non-flat area of the circuit board 30 may be located between the remaining three side edges of the circuit board 30 and corresponding side edges of the display substrate 10. All of the electronic components 32 may be disposed in the non-flat area of the first surface of the circuit board 30, and the electronic components 32 may not be disposed on the surface of the circuit board 30 facing away from the display substrate 10, thus ensuring that the surface of the circuit board 30 facing away from the display substrate 10 is relatively flat, which is beneficial to the alignment and fixation of the display module in assembly of the complete machine.

In some exemplary embodiments, as shown in FIG. 2, a connector 33 may be disposed on the surface of the circuit board 30 facing away from the display substrate 10, the connector 33 is configured to be connected with an external driving device to drive the display substrate 10 for display. The circuit board 30 may be a hard printed circuit board.

In some exemplary embodiments, as shown in FIG. 1, an outer circumferential contour shape and a size of the plastic frame 40 may be the same as a contour shape and a size of the circuit board 30. The opening 410 may be provided at a middle position of the frame plate 41.

In some exemplary embodiments, a material of the plastic frame may be polycarbonate (PC), or acrylonitrile-butadiene-styrene copolymer (ABS), or the like.

In some exemplary embodiments, as shown in FIG. 3, a surface of the display substrate 10 facing the circuit board 30 may be fixed to the first surface of the circuit board 30 by an adhesive layer (not shown). A height of the second annular support portion 43 may be greater than a thickness of the adhesive layer.

Figure 7:
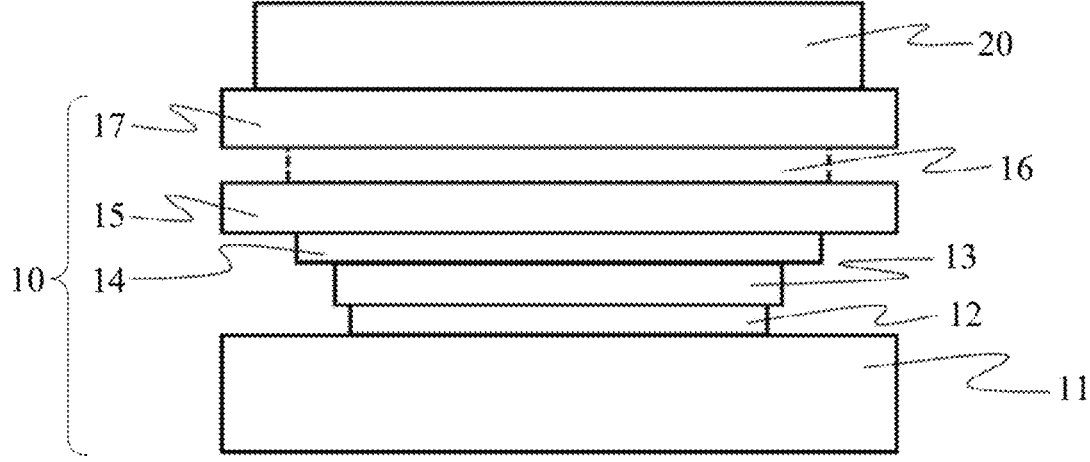
FIG. 7 is a schematic diagram of a film layer structure and a structure of a cover plate of a display substrate of a display module according to some exemplary embodiments.

In some exemplary embodiments, as shown in FIG. 7, FIG. 7 is a schematic diagram of a film layer structure and a structure of a cover plate of a display substrate of the display module according to some exemplary embodiments. The display substrate 10 may include a driving backplate 11, and an anode 12, a light emitting functional layer 13, a cathode layer 14, a first encapsulation layer 15, a color filter layer 16, and a second encapsulation layer 17 that are sequentially stacked on the driving backplate 11. The cover plate 20 may be cover the second encapsulation layer 17. The driving backplate 11 may include a base substrate and a driving circuit layer disposed on the base substrate. The driving circuit layer includes a pixel driving circuit, and the pixel driving circuit may include multiple transistors and a capacitor. The anode 12, the light emitting functional layer 13 and the cathode layer 14 are sequentially stacked to form a light emitting device.

Exemplarily, the display substrate 10 may be a silicon-based OLED display substrate, the base substrate may be a silicon substrate, and the pixel driving circuit may be manufactured using a CMOS integrated circuit process, and may be manufactured by a 180 nm or 110 nm semiconductor process. The light emitting device may be a white light OLED device and may be a series-type OLED device structure. The anode 12 of the light emitting device may be made of a metal or/and metal oxide material having electrical conductivity and a high work function value. The anode 12 may be in a single-layer structure or a multi-layer structure, for example, the anode 12 may include a first titanium metal layer, an aluminum or silver metal layer, a second titanium metal layer, and an indium tin oxide (ITO) layer that are sequentially stacked in a direction away from the driving backplate 11. The cathode layer 14 of the light emitting device may be made of a magnesium-silver alloy or the like. The first encapsulation layer 15 and the second encapsulation layer 17 may be made of one or more of an organic material and an inorganic material having good sealing performance. The inorganic material may be, for example, silicon oxide, silicon nitride, or the like. The first encapsulation layer 15 and the second encapsulation layer 17 may serve a function of blocking moisture and oxygen and protecting the light emitting device from erosion of water and oxygen. The color filter layer 16 may include multiple filter units capable of transmitting light of a set color, for example, including a red filter unit capable of transmitting red light, a green filter unit capable of transmitting green light, and a blue filter unit capable of transmitting blue light. The white light emitted by each light emitting device passes through a corresponding filter unit and then emits light of a corresponding color, so as to achieve colorized displaying of the display substrate 10. The cover plate 20 may cover the second encapsulation layer 17 of the display substrate 10, and the cover plate 20 may be made of a high transmittance material, such as glass.

Figure 8:
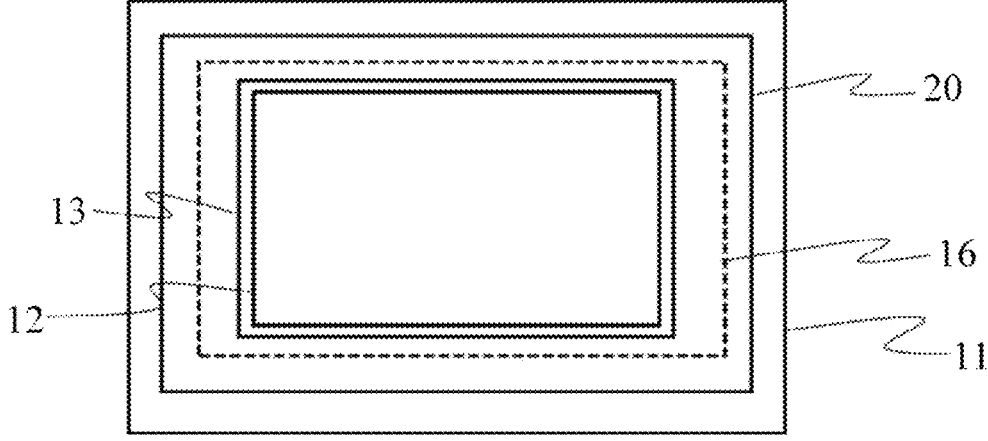
FIG. 8 is a schematic diagram of a planar structure of a display substrate and a cover plate of a display module according to some exemplary embodiments.

As shown in FIG. 8, FIG. 8 is a schematic diagram of a planar structure of a display substrate and a cover plate of a display module in some exemplary embodiments, the display substrate includes a display area and a non-display area located at a periphery of the display area. The cover plate 20 completely covers the display area of the display substrate, and a circumferential edge of the display substrate (i.e., the circumferential edge of the driving back plate 11) can protrude from the circumferential edge of the cover plate 20, leaving a certain distance at the periphery of the display substrate without being covered by the cover plate 20, which can be used for positioning and fixing the display module in the complete machine. An orthographic projection of the light emitting functional layer 13 on the driving backplate 11 may contain an orthographic projection of the anode 12 of the light emitting device on the driving backplate 11. An orthographic projection of the color filter layer 16 on the driving back plate 11 may contain the orthographic projection of the light emitting functional layer 13 on the driving back plate 11.

Figure 9:
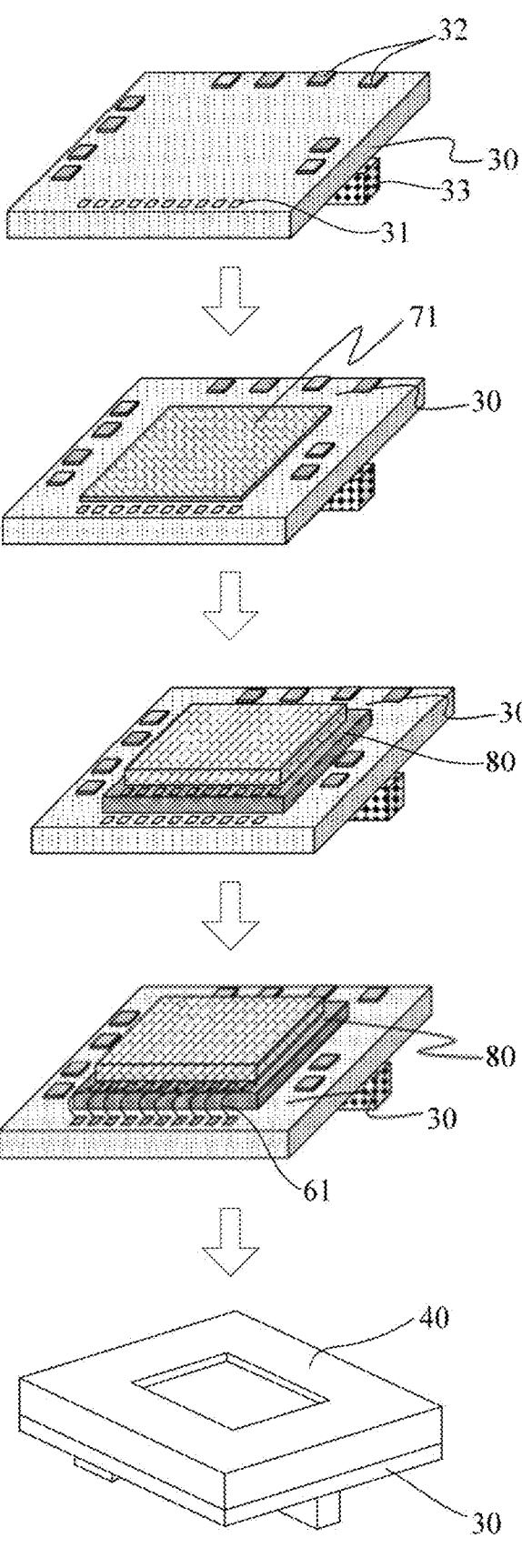
FIG. 9 is a flow diagram for manufacturing a display module according to some exemplary embodiments.

In some exemplary embodiments, as shown in FIG. 9, FIG. 9 is flow diagram for manufacturing a display module according to some exemplary embodiments, a manufacturing process of the display module may include following steps: (1) A circuit board 30 is manufactured. The circuit board 30 may be a hard printed circuit board (PCB), and a first surface of the circuit board 30 includes a flat area and an non-flat area located at a periphery of the flat area, and the non-flat area is provided with second pads 31 and electronic components 32, such as a resistor, a capacitor, an inductor, a power chip (power IC), etc. Multiple second pads 31 are provided and may be arranged in one or two rows, the second pads 31 are disposed to be close to one side edge of the circuit board 30, and the electronic components 32 are disposed to be close to the remaining side edges of the circuit board 30. A connector 33 is disposed on a second surface (a surface facing away from the first surface) of the circuit board 30, and the connector 33 is configured to be connected with an external driving device to realize transmission of an electrical signal. (2) An adhesive 71 is coated on the flat area of the first surface of the circuit board 30, wherein the adhesive 71 is used for fixing a display substrate of a display panel. (3) During effective operation time of the adhesive 71, the display panel 80 (including the display substrate and the cover plate attached together) is adhered to the flat area of the circuit board 30, and then the adhesive 71 is cured (an adhesive layer is formed after the adhesive 71 is cured), so that the attachment is completed. (4) Wiring is performed on first pads of the bonding area of the display substrate, and the metal line 61 is connected to the second pads 31 of the circuit board 30 to electrically connect the first pads to the second pads 31, thereby completing the wiring operation. (5) A plastic frame 40 is fixed to the circuit board 30. The plastic frame 40 is aligned with the circuit board 30 at first, and then, as shown in FIG. 3, an end face of the first annular support portion 42 of the plastic frame 40 is glued and fixed to a portion of the first surface of the circuit board 30 close to the circumferential edge, so that the plastic frame 40 is adhered and fixed to the circuit board 30. Alternatively, as shown in FIG. 5, a glue 52 may be point-coated on a first side surface of the frame plate 41 of the plastic frame 40, and the glue 52 may be filled between the first annular support portion 42, the frame plate 41 and a second annular support portion 43 of the plastic frame 40, and then the plastic frame 40 may be adhered and fixed to the circuit board 30.

A display device is further provided in an embodiment of the present disclosure, which includes the display module described in any of the aforementioned embodiments. The display device may be a near-eye display device, such as AR/VR glasses, a helmet display, and the like.

In the accompanying drawings, a size of a constituent element, and a thickness of a layer or an area are sometimes exaggerated for clarity. Therefore, an implementation of the present disclosure is not necessarily limited to the size, and the shape and size of each component in the drawings do not reflect an actual scale. In addition, the drawings schematically illustrate some examples, and an implementation of the present disclosure is not limited to the shapes or numerical values shown in the drawings.

In the description herein, "parallel" refers to a state in which an angle formed by two straight lines is above −10° and below 10°, and thus also includes a state in which the angle is above −5° and below 5°. In addition, "vertical" refers to a state in which an angle formed by two straight lines is above 80° and below 100°, and thus also includes a state in which the angle is above 85° and below 95°.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation.

Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the description herein, unless otherwise specified and defined explicitly, terms "connection", "fixed connection", "installation" and "assembly" should be understood in a broad sense, and, for example, they may be a fixed connection, a detachable connection or an integrated connection; the terms "installation", "connection" and "fixed connection" may be a direct connection, an indirect connection through intermediate components, or an internal communication between two components. For those ordinarily skilled in the art, meanings of the above terms in the embodiments of the present disclosure may be understood according to situations.

The invention claimed is:

1. A display module, comprising a circuit board and a display substrate disposed on a first surface of the circuit board, wherein the first surface of the circuit board comprises a flat area and an edge area located at a periphery of the flat area, the display substrate is disposed in the flat area, and the edge area is provided with electronic components, wherein the display module further comprises a plastic frame disposed on the first surface of the circuit board and a cover plate disposed on a surface of the display substrate facing away from the circuit board;

wherein the display substrate comprises a display area and a non-display area located at a periphery of the display area, and the cover plate completely covers the display area;

the plastic frame comprises a frame plate provided with an opening and a first annular support portion disposed on a first side surface of the frame plate and disposed along a circumferential edge of the frame plate away from the opening; the first annular support portion is fixed on a portion of the first surface of the circuit board close to the circumferential edge, and a portion of the first side surface of the frame plate close to the opening is supported on the cover plate, and an orthographic projection of the opening on the circuit board contains an orthographic projection of the display area on the circuit board.

2. The display module according to claim 1, wherein in a direction perpendicular to the display substrate, heights of the electronic components are lower than a height of a surface of the display substrate facing away from the circuit board.

3. The display module according to claim 1, wherein in a plane parallel to the display substrate, a distance between an edge of the circuit board and an edge of the display substrate is greater than a distance between an edge of the display area and an edge of the non-display area.

4. The display module according to claim 1, wherein the plastic frame covers the edge area.

5. The display module according to claim 4, wherein the plastic frame also covers the non-display area of the display substrate and exposes the display area.

6. The display module according to claim 5, wherein the non-display area comprises a bonding area located at a side of the display area, and the bonding area is provided with a first pad; a second pad is disposed at a position in the edge area close to the bonding area, and the first pad is connected with the second pad through a metal line; the plastic frame also covers the metal line.

7. The display module according to claim 6, wherein the first pad is disposed to be close to a first side edge of the display substrate, and the second pad is disposed to be close to a first side edge of the circuit board, and a distance between the first side edge of the circuit board and the first side edge of the display substrate is greater than a distance between remaining side edges of the circuit board and corresponding side edges of the display substrate.

8. The display module according to claim 6, wherein a test pad is disposed on a surface of the circuit board facing away from the display substrate at a position corresponding to the bonding area, and the bonding area is further provided with a third pad connected with the test pad.

9. The display module according to claim 1, wherein a second annular support portion is provided on the first side surface of the frame plate along a circumferential edge of the opening, and the second annular support portion is supported on the cover plate.

10. The display module according to claim 9, wherein the non-display area comprises a bonding area located at a side of the display area, and the bonding area is provided with a first pad; a second pad is disposed at a position of the edge area close to the bonding area, and the first pad is connected with the second pad through a metal line;

the cover plate exposes the first pad, a circumferential edge of the cover plate protrudes from a circumferential edge of the display area, and a circumferential edge of the display substrate protrudes from the circumferential edge of the cover plate; and the second annular support portion is supported on a portion of the cover plate close to the circumferential edge of the cover plate and on the non-display area of the display substrate except the bonding area.

11. The display module according to claim 9, wherein a glue is filled between the first side surface of the frame plate and the circuit board, and the glue fixes the plastic frame to the circuit board.

12. The display module according to claim 9, wherein a surface of the display substrate facing the circuit board is fixed to the circuit board by an adhesive layer, and a height of the second annular support portion is greater than a thickness of the adhesive layer.

13. The display module according to claim 1, wherein an end face of the first annular support portion away from the frame plate is fixed on the circuit board through a fixing glue.

14. The display module according to claim 1, wherein an orthographic projection of the cover plate on the circuit board contains the orthographic projection of the opening on the circuit board.

15. The display module according to claim 1, wherein a circumferential contour shape and a size of the plastic frame are the same as a contour shape and a size of the circuit board.

16. The display module according to claim 1, wherein the plastic frame is made of polycarbonate or acrylonitrile-butadiene-styrene copolymer.

17. The display module according to claim 1, wherein the non-display area comprises a bonding area located at a side of the display area, and the bonding area is bonded and connected to the circuit board, a circumferential edge of the cover plate protrudes from a circumferential edge of the display area; a side edge of the bonding area away from the display area protrudes from a corresponding side edge of the cover plate, and remaining side edges of the display substrate protrude from or are flush with corresponding side edges of the cover plate.

18. The display module according to claim 1, wherein a surface of circuit board facing away from the display substrate is provided with a connector, and the connector is configured to be connected with an external driving device.

19. A display device, comprising the display module according to claim 1.

* * * * *